(12) United States Patent
Hyung

(10) Patent No.: US 11,785,795 B2
(45) Date of Patent: Oct. 10, 2023

(54) DISPLAY DEVICE INCLUDING PROTECTIVE LAYER BELOW SUBSTRATE

(71) Applicant: Samsung Display Co., LTD., Yongin-si (KR)

(72) Inventor: Jun-Woo Hyung, Seongnam-si (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 243 days.

(21) Appl. No.: 17/103,272

(22) Filed: Nov. 24, 2020

(65) Prior Publication Data

US 2021/0257590 A1 Aug. 19, 2021

(30) Foreign Application Priority Data

Feb. 14, 2020 (KR) .................. 10-2020-0018039

(51) Int. Cl.
*H01L 51/00* (2006.01)
*H01L 51/52* (2006.01)
*H01L 27/32* (2006.01)
*G02F 1/13* (2006.01)
*G09G 3/32* (2016.01)
*G02F 1/1335* (2006.01)
(Continued)

(52) U.S. Cl.
CPC .... *H01L 51/5253* (2013.01); *G02F 1/133331* (2021.01); *G02F 1/133528* (2013.01); *G09G 3/3266* (2013.01); *G09G 3/3275* (2013.01); *G09G 2300/0408* (2013.01); *H01L 27/3276* (2013.01); *H01L 51/0097* (2013.01); *H01L 51/5293* (2013.01); *H01L 2251/301* (2013.01); *H01L 2251/5338* (2013.01)

(58) Field of Classification Search
CPC ............ H01L 51/5253; H01L 51/5293; H01L 51/0097; H01L 2251/531; H01L 2251/5338; H01L 2251/558; H01L 27/3234; H01L 27/3248; H01L 27/3258; H01L 27/3246; H01L 27/3262; H01L 27/3279; H01L 27/32; H01L 27/3276; H01L 27/3297; G02F 1/133528; G02F 1/133331; G09G 3/3266; G09G 3/3275; G09G 2300/0408
See application file for complete search history.

(56) References Cited

U.S. PATENT DOCUMENTS 9,437,132 B2 9/2016 Rappoport et al.
10,123,424 B1 11/2018 Lee et al.
(Continued)

FOREIGN PATENT DOCUMENTS

KR 10-2014-0092119 7/2014
KR 10-1841583 3/2018
(Continued)

*Primary Examiner* — Ida M Soward
(74) *Attorney, Agent, or Firm* — Kile Park Reed & Houtteman PLLC

(57) ABSTRACT

Disclosed is a display device that includes a substrate including a first display region and a second display region adjacent to the first display region, a pixel layer disposed on the substrate and including transmission regions that overlap the first display region, and a protective layer below the substrate. The protective layer includes a first part below the first display region and a second part below the second display region. The first part has a thickness less than a thickness of the second part.

20 Claims, 17 Drawing Sheets

(51) Int. Cl.
　　　*G02F 1/1333*　　　(2006.01)
　　　*G09G 3/3275*　　　(2016.01)
　　　*G09G 3/3266*　　　(2016.01)

(56) References Cited

U.S. PATENT DOCUMENTS

| | | | |
|---|---|---|---|
| 10,306,773 | B2 | 5/2019 | Kim et al. |
| 2012/0256199 | A1* | 10/2012 | Lee ................... G02F 1/13452 |
| | | | 438/34 |
| 2014/0198468 | A1 | 7/2014 | Kim et al. |
| 2018/0341290 | A1 | 11/2018 | Sim et al. |
| 2020/0098843 | A1* | 3/2020 | Jeon ................... H01L 27/3265 |
| 2020/0137900 | A1* | 4/2020 | Park ................... G02F 1/13452 |
| 2020/0186688 | A1* | 6/2020 | Chen ................... H04N 5/2257 |
| 2020/0285123 | A1* | 9/2020 | Kim ................... G02F 1/133331 |
| 2020/0310112 | A1* | 10/2020 | Hirose ................... H01L 31/18 |
| 2020/0312926 | A1* | 10/2020 | Bae ................... G09G 3/3266 |
| 2020/0312927 | A1* | 10/2020 | Bae ................... H01L 27/326 |
| 2021/0091343 | A1 | 3/2021 | Lee et al. |
| 2021/0271844 | A1* | 9/2021 | Cao ................... H01L 51/0097 |
| 2021/0325943 | A1* | 10/2021 | Kwak ................... G02B 5/3025 |
| 2021/0405407 | A1* | 12/2021 | Sun ................... G02F 1/1347 |

FOREIGN PATENT DOCUMENTS

| | | |
|---|---|---|
| KR | 10-2018-0130151 | 12/2018 |
| KR | 10-2019-0016630 | 2/2019 |
| KR | 10-2019-0053732 | 5/2019 |
| KR | 10-2021-0035378 | 4/2021 |

\* cited by examiner

DISPLAY DEVICE INCLUDING PROTECTIVE LAYER BELOW SUBSTRATE

CROSS-REFERENCE TO RELATED APPLICATION(S)

This application claims priority to and benefits of Korean Patent Application No. 10-2020-0018039 under 35 U.S.C. § 119, filed in the Korean Intellectual Property Office on Feb. 14, 2020, the entire contents of which is hereby incorporated by reference.

BACKGROUND

1. Technical Field

The invention relates to a display device with increased light transmittance of a display region in which an electronic module may be disposed.

2. Description of the Related Art

Electronic products, such as smart phones, digital cameras, laptop computers, navigation systems, and smart televisions, include a display device for displaying an image. The display device generates an image and provides users with the image displayed on a display screen.

The display screen typically includes a display region and a non-display region that may surround the display region. The display region includes pixels to provide users with the images, and the non-display region may include no pixels and may correspond to a bezel of the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the invention provide a display device with increased light transmittance of a display region in which an electronic module may be disposed.

According to embodiments of the invention, a display device may comprise a substrate including a first display region and a second display region adjacent to the first display region, a pixel layer disposed on the substrate and including transmission regions that overlap the first display region, and a protective layer below the substrate. The protective layer may include: a first part in the first display region, and a second part in the second display region. The first part may have a thickness less than a thickness of the second part.

In some embodiments, the first part may include a first recess that may be recessed from a bottom surface of the protective layer toward a top surface of the protective layer. The bottom surface may be opposite to the top surface that faces the substrate.

In some embodiments, a first top surface of the first part and a second top surface of the second part may be disposed on a same plane. A distance between a first bottom surface of the first part and the first top surface of the first part may be less than a distance between a second bottom surface of the second part and the second top surface of the second part.

In some embodiments, the first bottom surface may be parallel to the first top surface.

In some embodiments, the first bottom surface may have a concave shape with respect to the first top surface.

In some embodiments, the first bottom surface may have a convex shape with respect to the first top surface.

In some embodiments, the protective layer may further include third parts in the transmission regions. Each of the third parts may have a thickness less than the thickness of the first part.

In some embodiments, the third parts may have second recesses that may be recessed from the first bottom surface of the first part toward the first top surface of the first part.

In some embodiments, the first top surface of the first part, the second top surface of the second part, and a third top surface of the third part may be disposed on a same plane. A distance between a third bottom surface of the third part and the third top surface of the third part may be less than the distance between the first bottom surface of the first part and the first top surface of the first part.

In some embodiments, the third bottom surface may have a concave shape with respect to the third top surface.

In some embodiments, each of the third parts may have an area greater than an area of a corresponding one of the transmission regions in a plan view.

In some embodiments, the first part may have an area greater than an area of the first display region in a plan view.

In some embodiments, the pixel layer may further include first light emitting regions in the first display region, and second light emitting regions in the second display region.

In some embodiments, a total area of the first light emitting regions per unit area may be smaller than a total area of the second light emitting regions per unit area in a plan view.

In some embodiments, the first light emitting regions may be disposed between the transmission regions.

In some embodiments, the second display region may surround the first display region in a plan view.

In some embodiments, the first display region may extend in a first direction from a side of the second display region in a plan view.

In some embodiments, the display device may further comprise an electronic module below the first part.

According to embodiments of the invention, a display device may comprise a substrate including a first display region and a second display region adjacent to the first display region, a pixel layer disposed on the substrate and including transmission regions that overlap the first display region, a protective layer below the substrate, and an electronic module that overlaps the first display region and may be disposed below the protective layer. The protective layer may include a recess that overlaps the first display region.

In some embodiments, the recess may be recessed from a bottom surface of the protective layer toward a top surface of the protective layer. The bottom surface may be opposite to the top surface.

DETAILED DESCRIPTION OF EMBODIMENTS

Figure 1:
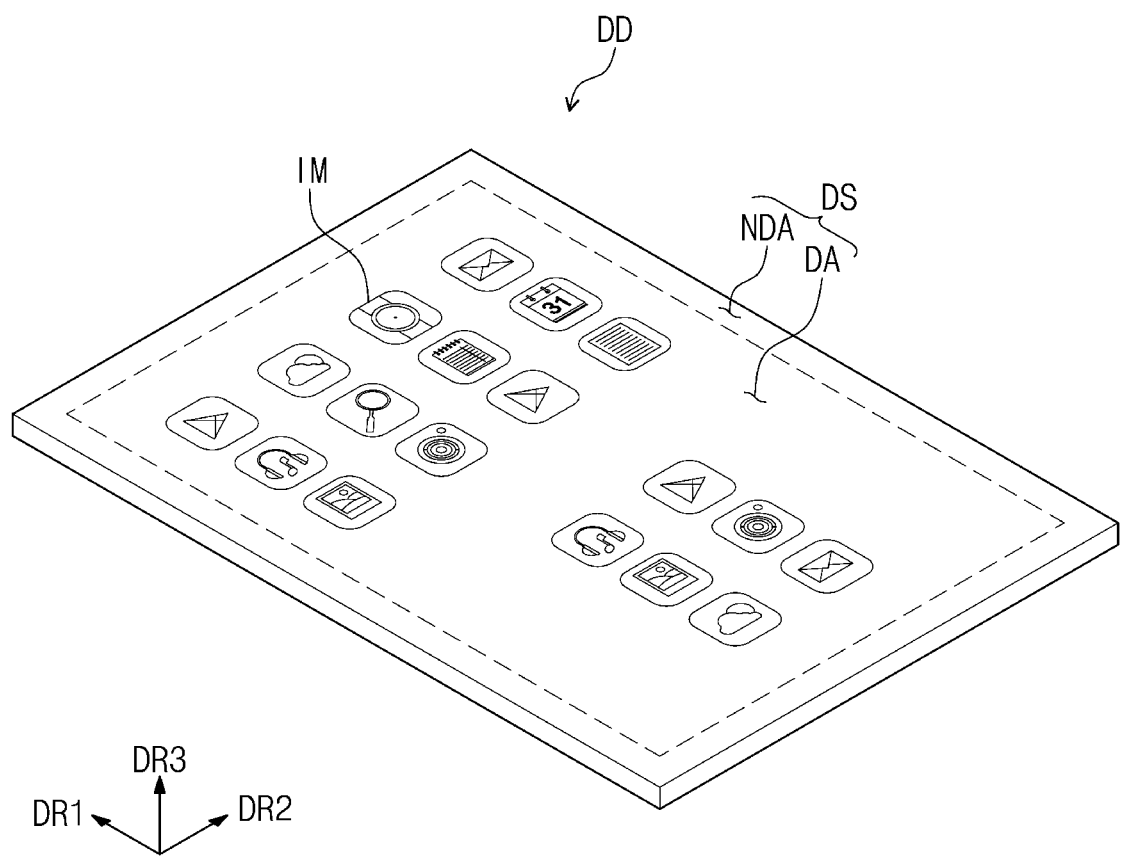
FIG. 1 schematically illustrates a perspective view showing a display device according to embodiments of the invention.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals indicate like components. Moreover, in the drawings, thicknesses, ratios, and dimensions of components may be exaggerated for effectively explaining the technical contents.

The term "and/or" includes one or more combinations defined by associated components. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc. may be used herein to describe various components, these components should not be limited by these terms. These terms are only used to distinguish one component from another component. For example, a first component could be termed a second component, and vice versa without departing from the scope of the invention. Unless the context clearly indicates otherwise, the singular forms are intended to include the plural forms as well.

The terms "beneath", "lower", "above", "upper", and the like are used herein to describe one component's relationship to other component(s) illustrated in the drawings. The relative terms are intended to encompass different orientations in addition to the orientation depicted in the drawings.

The term overlap may include laminate, stack, face or facing, extending over, extending under, covering or partly covering or any other suitable term as would be appreciated and understood by those of ordinary skill in the art.

Unless otherwise defined, all terms used herein including technical and scientific terms have the same meaning generally understood by one of ordinary skilled in the art. Also, terms should be understood as having meaning identical as terms defined in dictionaries generally used or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe in detail some embodiments of the invention in conjunction with the accompanying drawings.

FIG. 1 schematically illustrates a perspective view showing a display device according to embodiments of the invention.

Referring to FIG. 1, a display device DD according to some embodiments of the invention may have a rectangular shape with long sides that extend in a first direction DR1 and short sides that extend in a second direction DR2 intersecting the first direction DR1. The invention, however, is not limited thereto, and the display device DD may have various shapes such as a circular shape or a polygonal shape.

A third direction DR3 may be defined herein as a direction that substantially vertically intersects a plane defined by the first and second directions DR1 and DR2.

The display device DD may have a top surface, which may be defined as a display surface DS and has a plane defined by the first and second directions DR1 and DR2. The display surface DS may provide users with images IM generated from the display device DD.

The display surface DS may include a display region DA and a non-display region NDA adjacent to the display region DA. The display region DA may display the images IM, and the non-display region NDA may not display the images IM. The non-display region NDA may surround the display region DA. The non-display region NDA may define a bezel of the display device DD.

The display device DD may be used for large-sized display apparatuses such as televisions, monitors, or outdoor billboards. The display device DD may be used for small and medium-sized electronic products, such as personal computers, laptop computers, personal digital terminals, automotive navigation systems, game consoles, smart phones, tablet computers, or cameras. These products are presented as examples and the display device DD may be used for any other electronic products without departing from the inventive concepts.

Figure 2:
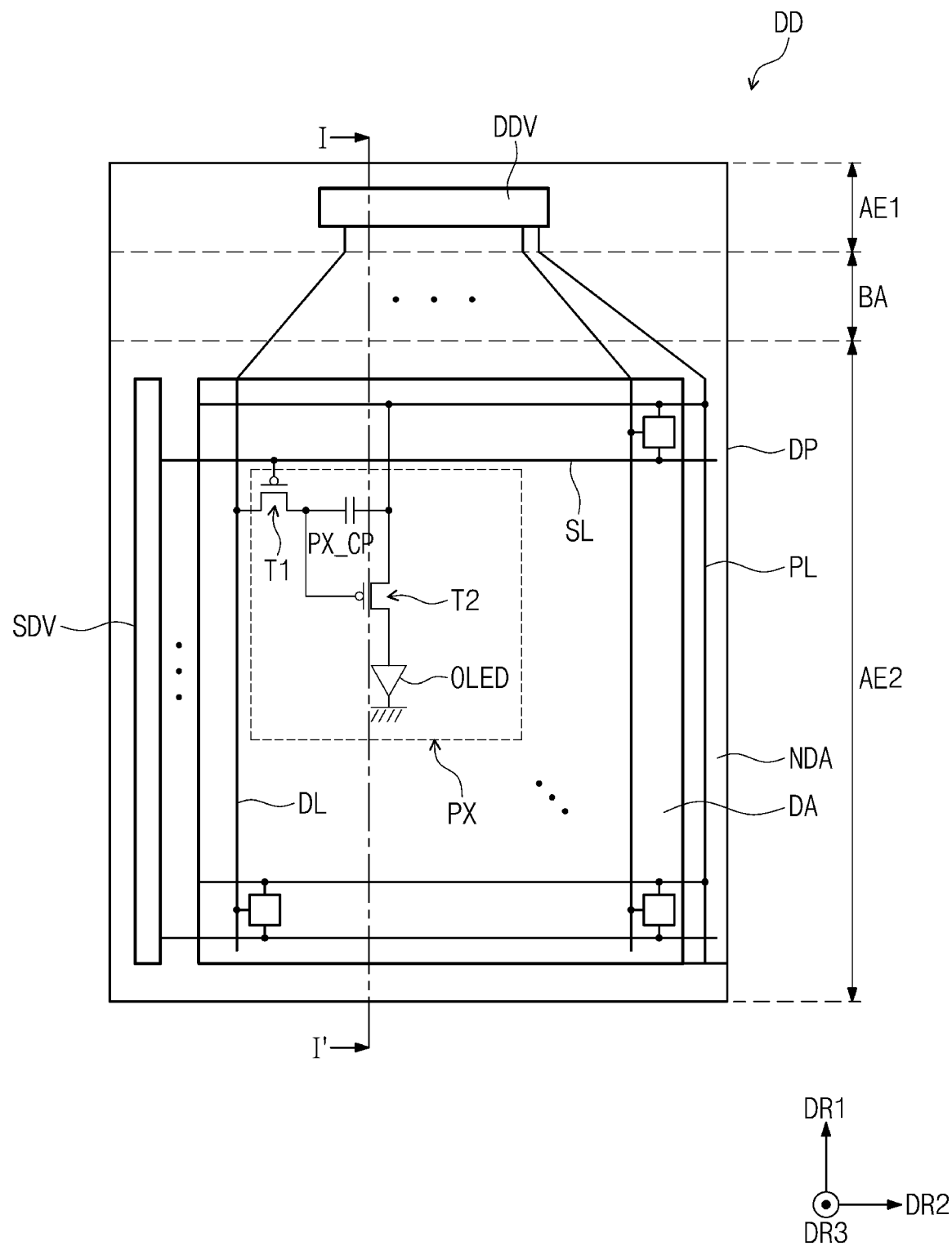
FIG. 2 schematically illustrates a plan view showing an unfolded state of the display device depicted in FIG. 1.

FIG. 2 schematically illustrates a plan view showing an unfolded state of the display device depicted in FIG. 1.

Referring to FIG. 2, the display device DD according to some embodiments of the invention may include a display panel DP, a scan driver SDV, and a data driver DDV.

The display panel DP may be a flexible display panel. For example, the display panel DP may include electronic elements disposed on a flexible substrate. The display panel DP may have a rectangular shape with long sides that extend in the first direction DR1 and short sides that extend in the second direction DR2. As mentioned above, the third direction DR3 may be defined herein as a direction that substantially vertically intersects a plane defined by the first and second directions DR1 and DR2.

The display panel DP may include a first region AE1, a second region AE2, and a bending region BA between the first and second regions AE1 and AE2. The bending region BA may extend in the second direction DR2, and the first region AE1, the bending region BA, and the second region AE2 may be arranged in the first direction DR1.

The second region AE2 may include a display region DA and a non-display region NDA around the display region DA. The first region AE1 and the bending region BA may be a portion of the non-display region NDA. For example, the first region AE1 and the bending region BA may be defined as a bezel region.

The display panel DP may include pixels PX, scan lines SL, data lines DL, and power lines PL. Although the pixels PX may be arranged in a matrix shape, the invention is not limited and the pixels PX may be arranged in various shapes. The pixels PX may be disposed in the display region DA, and may be electrically connected to the scan lines SL, the data lines DL, and the power lines PL.

The pixel PX may include a first transistor T1, a second transistor T2, a capacitor PX_CP, and a light emitting element OLED. It may be enough for a pixel driver circuit to include a switching transistor and a driver transistor, but the invention is not limited to the embodiment shown in FIG. 2. The first transistor T1 may be electrically connected to the scan line SL and the data line DL. The light emitting element OLED may receive a power voltage provided from the power line PL.

The scan driver SDV may be disposed in the non-display region NDA, and the data driver DDV may be disposed in the first region AE1. The scan driver SDV may be disposed in the non-display region NDA adjacent to the long side of the display panel DP. The data driver DDV may be fabricated in the form of an integrated circuit chip, and may be disposed in the first region AE1.

The scan lines SL may extend in the second direction DR2 and may have connection with the scan driver SDV. The data lines DL may extend in the first direction DR1 and may have connection through the bending region BA with the data driver DDV. The power lines PL may extend in the first direction DR1 and may have connection with an external power.

The scan driver SDV may generate scan signals, which may be applied through the scan lines SL to the pixels PX. The scan signals may be sequentially applied to the pixels PX. The data driver DDV may generate data voltages, which may be applied through the data lines DL to the pixels PX.

Although not shown, the display device DD may further include a timing controller (not shown) that controls operations of the scan driver SDV and the data driver DDV.

In response to control signals from the outside, the timing controller may generate a scan control signal, a data control signal, and a light emitting control signal. The timing controller may receive image signals from the outside, and may convert data formats of the image signals to match an interface specification of the data driver DDV and may provide the data driver DDV with the converted image signals.

In response to the scan control signal, the scan driver SDV may generate the scan signals. The data driver DDV may receive the image signals whose data formats are converted, and in response to the data control signal, may generate data voltages that correspond to the image signals. In response to the scan signals, the pixels PX may be provided with the data voltages.

Figure 3:
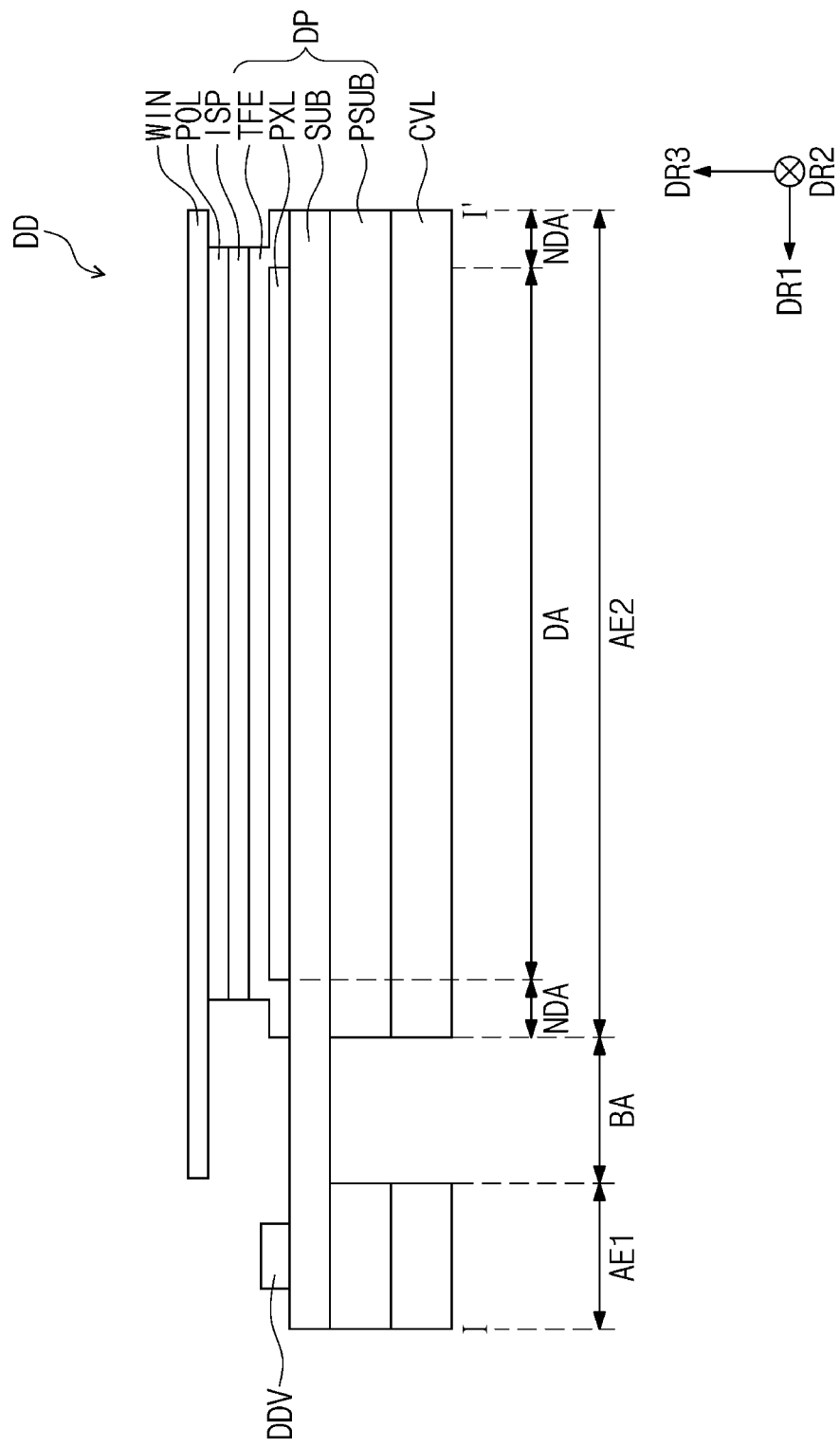
FIG. 3 schematically illustrates a cross-sectional view taken along line I-I' of FIG. 2.

FIG. 3 schematically illustrates a cross-sectional view taken along line I-I' of FIG. 2.

Referring to FIG. 3, the display device DD may include a display panel DP, an input sensing part ISP disposed on the display panel DP, an antireflection layer POL disposed on the input sensing part ISP, a window WIN disposed on the antireflection layer POL, and a cover layer CVL disposed below the display panel DP.

The display panel DP according to some embodiments of the invention may be alight emitting type display panel. For example, the display panel DP may be an organic light emitting display panel or a quantum-dot light emitting display panel. An emission layer of the organic light emitting display panel may include an organic light emitting material. An emission layer of the quantum-dot light emitting display panel may include a quantum-dot or a quantum-rod. The following will describe an example in which the display panel DP may be an organic light emitting display panel.

The display panel DP may include a substrate SUB, a pixel layer PXL disposed on the substrate SUB, a thin-film encapsulation layer TFE disposed on the substrate SUB so as to cover the pixel layer PXL, and a protective layer PSUB disposed below the substrate SUB.

The substrate SUB may include a transparent flexible plastic substrate. For example, the substrate SUB may include transparent polyimide (PI). Like the display panel DP, the substrate SUB may include a first region AE1, a second region AE2, and a bending region BA between the first and second regions AE1 and AE2. The bending region BA may extend in the second direction DR2, and the first region AE1, the bending region BA, and the second region AE2 may be arranged in the first direction DR1. The second region AE2 may include a display region DA and a non-display region NDA around the display region DA.

The pixel layer PXL may be disposed in the display region DA. The pixel layer PXL may be provided therein with pixels PX shown in FIG. 2. The data driver DDV may be disposed in the first region AE1. The data driver DDV may be defined herein as a driver chip. A detailed structure of the pixel layer PXL will be further discussed below.

The thin-film encapsulation layer TFE may be disposed in the second region AE2 so as to cover the pixel layer PXL. The thin-film encapsulation layer TFE may include at least two inorganic layers and an organic layer between the inorganic layers. The inorganic layers may include an inorganic material, and may protect the pixel layer PXL against moisture and/or oxygen. The organic layer may include an organic material, and may protect the pixel layer PXL against foreign substances such as dust particles.

The protective layer PSUB may protect a lower portion of the substrate SUB. The protective layer PSUB may be disposed in the first region AE1 and the second region AE2, but not in the bending region BA. The protective layer PSUB may include a transparent flexible plastic substrate. For example, the protective layer PSUB may include a plastic film that includes one selected from the group of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ethersulfone), or and a combination thereof.

The input sensing part ISP may be disposed on the thin-film encapsulation layer TFE. The input sensing part ISP may detect an external input such as user's touch, and may convert the external input into an input signal and provide the display panel DP with the input signal. The input sensing part ISP may include sensors (not shown) that detect the external input. The sensors may use a capacitive method to detect the external input. The display panel DP may receive the input signal from the input sensing part ISP and may generate an image that corresponds to the input signal.

The antireflection layer POL may be disposed on the input sensing part ISP. For example, the antireflection layer POL may be an external-light antireflection film. The antireflection layer POL may reduce a reflectance of external light that may be incident toward the display panel DP from outside the display device DD. For example, the antireflection layer POL may include one or more of a retarder and a polarizer.

The window WIN may be disposed on the antireflection layer POL. The window WIN may protect the display panel DP and the input sensing part ISP against external scratches and impact. Although not shown, the window WIN may be attached through an adhesive to the input sensing part ISP. The adhesive may include an optically clear adhesive. An image generated from the display panel DP may pass through the window WIN and may be provided to users.

The cover layer CVL may be disposed below the display panel DP. The cover layer CVL may include one or more functional layers. For example, the cover layer CVL may include a cushion layer. The cushion layer may be a synthetic resin foam including a matrix member and pores. The pores may easily absorb impact applied to the display panel DP.

The cover layer CVL may be disposed below the protective layer PSUB in the first and second regions AE1 and AE2. The cover layer CVL may not be disposed in the bending region BA.

Although not shown, an adhesive layer may be disposed between the substrate SUB and the protective layer PSUB and between the cover layer CVL and the protective layer PSUB. For example, the adhesive layer may include a pressure sensitive adhesive. However, the invention is not limited thereto, and the adhesive layer may include various adhesives.

Figure 4:
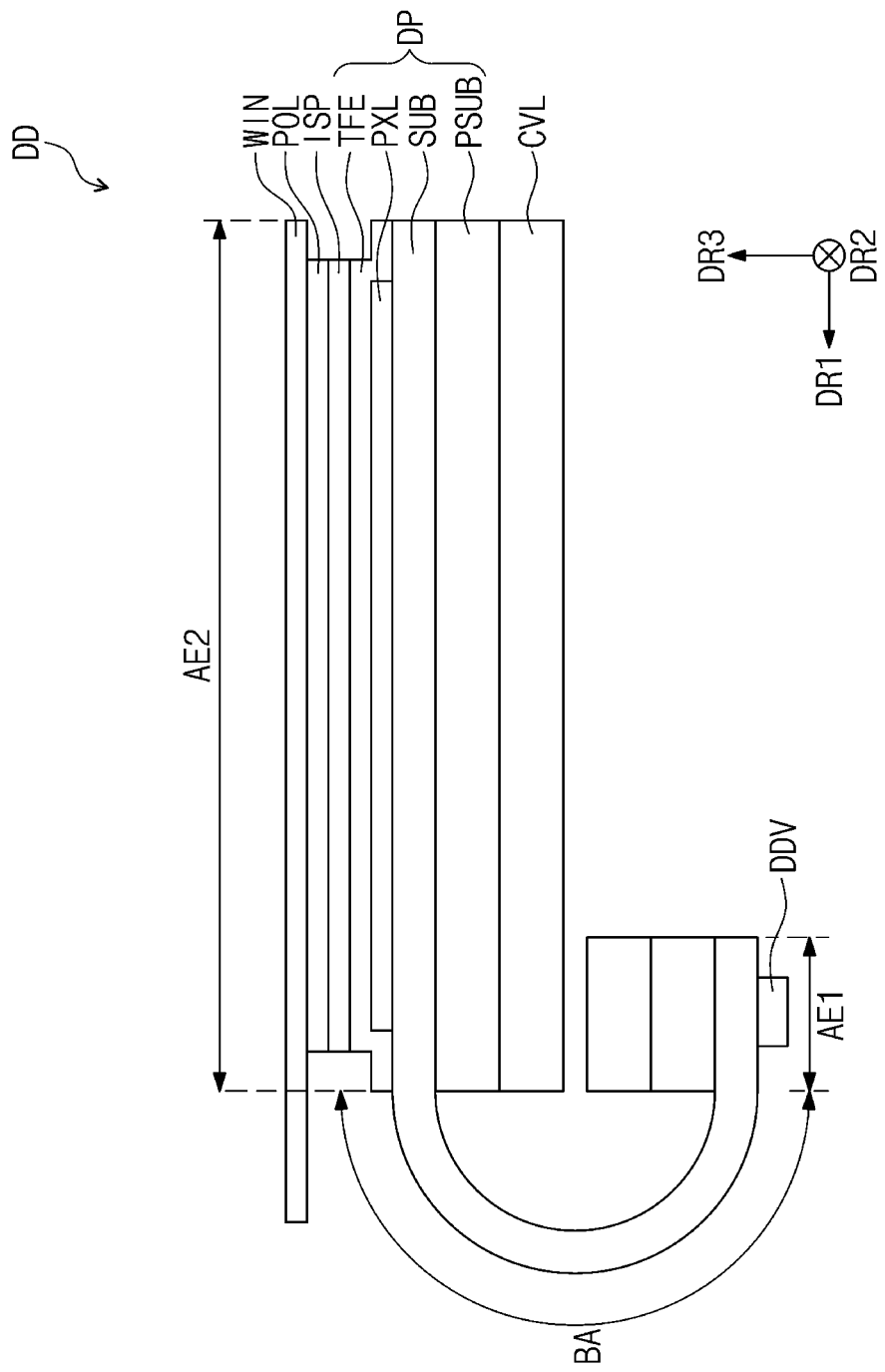
FIG. 4 schematically illustrates a cross-sectional view showing a folded state of the display device depicted in FIG. 3.

FIG. 4 schematically illustrates a cross-sectional view showing a folded state of the display device depicted in FIG. 3.

Referring to FIG. 4, the bending region BA may be bent toward the lower portion of display panel DP. The bending region BA may be bent to place the first region AE1 into position below the second region AE2. Therefore, the driver chip DDV may be disposed below the display panel DP. Since the first region AE1 may be disposed below a bottom surface of the second region AE2, the display panel DP may minimally decrease in its bezel region in a plan view.

Figure 5:
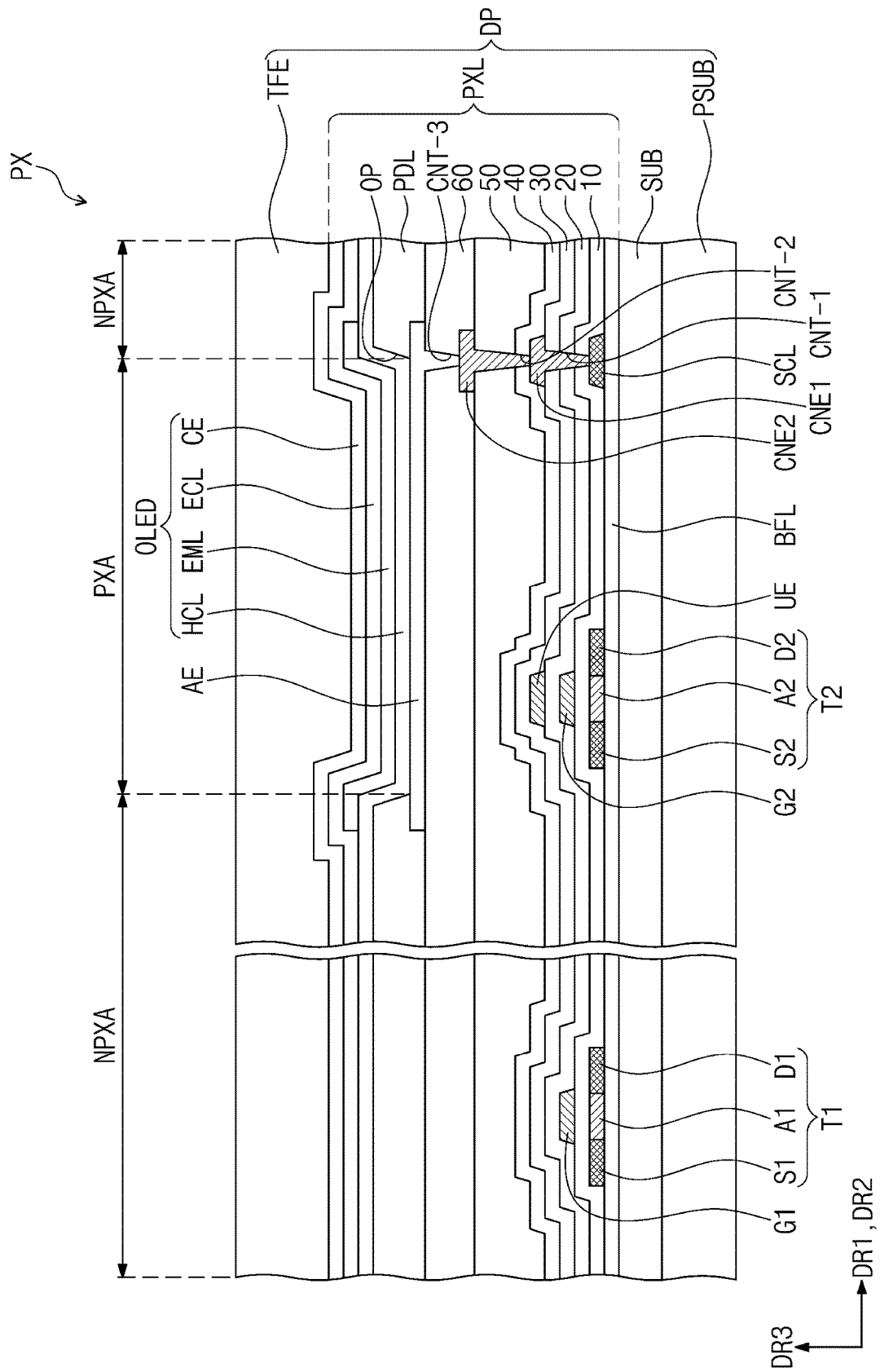
FIG. 5 schematically illustrates a cross-sectional view showing a pixel of FIG. 2.

FIG. 5 schematically illustrates a cross-sectional view showing the pixel of FIG. 2.

Referring to FIG. 5, the pixel layer PXL may include a buffer layer BFL, a first transistor T1, a second transistor T2, a first dielectric layer 10, a second dielectric layer 20, a third dielectric layer 30, a fourth dielectric layer 40, a fifth dielectric layer 50, a sixth dielectric layer 60, and light emitting elements OLED.

The buffer layer BFL may be disposed on the substrate SUB. The buffer layer BFL may include an inorganic material. The first transistor T1 and the second transistor T2 may be disposed on the buffer layer BFL.

A source S1, an active A1, and a drain D1 of the first transistor T1 may be formed from a semiconductor pattern, and a source S2, an active A2, and a drain D2 of the second transistor T2 may be formed from the semiconductor pattern. When viewed in cross-section, the source S1 and the drain D1 may extend in opposite directions from two sides opposite to each other of the active A1, and likewise, the source S2 and the drain D2 may extend in opposite directions from two sides opposite to each other of the active A2.

The first dielectric layer 10 may be disposed on the buffer layer BFL. The first dielectric layer 10 may commonly overlap a plurality of pixels PX and may cover the semiconductor pattern. The first dielectric layer 10 may be an inorganic or organic layer, and may have a single-layered or multi-layered structure. The first dielectric layer 10 may include one or more of aluminum oxide, titanium oxide, silicon oxide, silicon oxynitride, zirconium oxide, and hafnium oxide. In an embodiment, the first dielectric layer 10 may be a single-layered silicon oxide layer.

Gates G1 and G2 may be disposed on the first dielectric layer 10. The gates G1 and G2 may each be a portion of metal pattern. The gates G1 and G2 may overlap the actives A1 and A2, respectively. The gates G1 and G2 may serve as a mask used in a process for doping the semiconductor pattern.

The first dielectric layer 10 may be provided thereon with the second dielectric layer 20 that covers the gates G1 and G2. The second dielectric layer 20 may commonly overlap the plurality of pixels PX. The second dielectric layer 20 may be an inorganic or organic layer, and may have a single-layered or multi-layered structure. Like the first dielectric layer 10, the second dielectric layer 20 may be a single-layered silicon oxide layer.

An upper electrode UE may be disposed on the second dielectric layer 20. The upper electrode UE may overlap the gate G2 of the second transistor T2. The upper electrode UE may be a portion of a metal pattern. A portion of the gate G2 and its overlapping upper electrode UE may define a capacitor (see PX_CP of FIG. 2). In some embodiments, the upper electrode UE may be omitted.

The second dielectric layer 20 may be provided thereon with the third dielectric layer 30 that covers the upper electrode UE. In an embodiment, the third dielectric layer 30 may be a single-layered silicon oxide layer. A first connection electrode CNE1 may be disposed on the third dielectric layer 30. The first connection electrode CNE1 may be electrically coupled to a connection signal line SCL through a contact hole CNT-1 that penetrates the first, second, and third dielectric layers 10, 20, and 30.

The fourth dielectric layer 40 may be disposed on the third dielectric layer 30. The fourth dielectric layer 40 may be a single-layered silicon oxide layer. The fifth dielectric layer 50 may be disposed on the fourth dielectric layer 40. The fifth dielectric layer 50 may be an organic layer. A second connection electrode CNE2 may be disposed on the fifth dielectric layer 50. The second connection electrode CNE2 may be electrically coupled to the first connection electrode CNE1 through a contact hole CNT-2 that penetrates the fourth and fifth dielectric layers 40 and 50.

The fifth dielectric layer 50 may be provided thereon with the sixth dielectric layer 60 that covers the second connection electrode CNE2. The sixth dielectric layer 60 may be an organic layer. The light emitting element OLED may be disposed on the sixth dielectric layer 60. A first electrode AE of the light emitting element OLED may be electrically connected to the second connection electrode CNE2 through a contact hole CNT-3 that penetrates the sixth dielectric layer 60. Pixel openings OP may be defined in a pixel definition layer PDL. The pixel opening OP of the pixel definition layer PDL may expose at least a portion of the first electrode AE.

The pixel definition layer PDL may be disposed on the sixth dielectric layer 60. The pixel definition layer PDL may overlap a non-light emitting region NPXA. The pixel definition layer PDL may have pixel openings OP that overlap light emitting regions PXA.

The light emitting elements OLED may be disposed in the pixel openings OP defined in the pixel definition layer PDL. The light emitting elements OLED may each include a first electrode AE, a hole control layer HCL, an emission layer EML, an electron control layer ECL, and a second electrode CE.

The hole control layer HCL may be disposed in common in the light emitting region PXA and the non-light emitting region NPXA. The hole control layer HCL may include a hole transport layer, and may further include a hole injection layer. The emission layer EML may be disposed on the hole control layer HCL. The emission layer EML may be disposed in a region that corresponds to the pixel opening OP. For example, the emission layer EML may be formed in each of pixels PX.

The electron control layer ECL may be disposed on the emission layer EML. The electron control layer ECL may include an electron transport layer and may further include an electron injection layer. An open mask may be used such that the hole control layer HCL and the electron control layer ECL may be formed in common in the plurality of pixels PX. The second electrode CE may be disposed on the electron control layer ECL. The second electrode CE may have a unitary shape, and may be disposed in common in the plurality of pixels PX. The thin-film encapsulation layer TFE may be disposed on the second electrode CE.

Figure 6A:
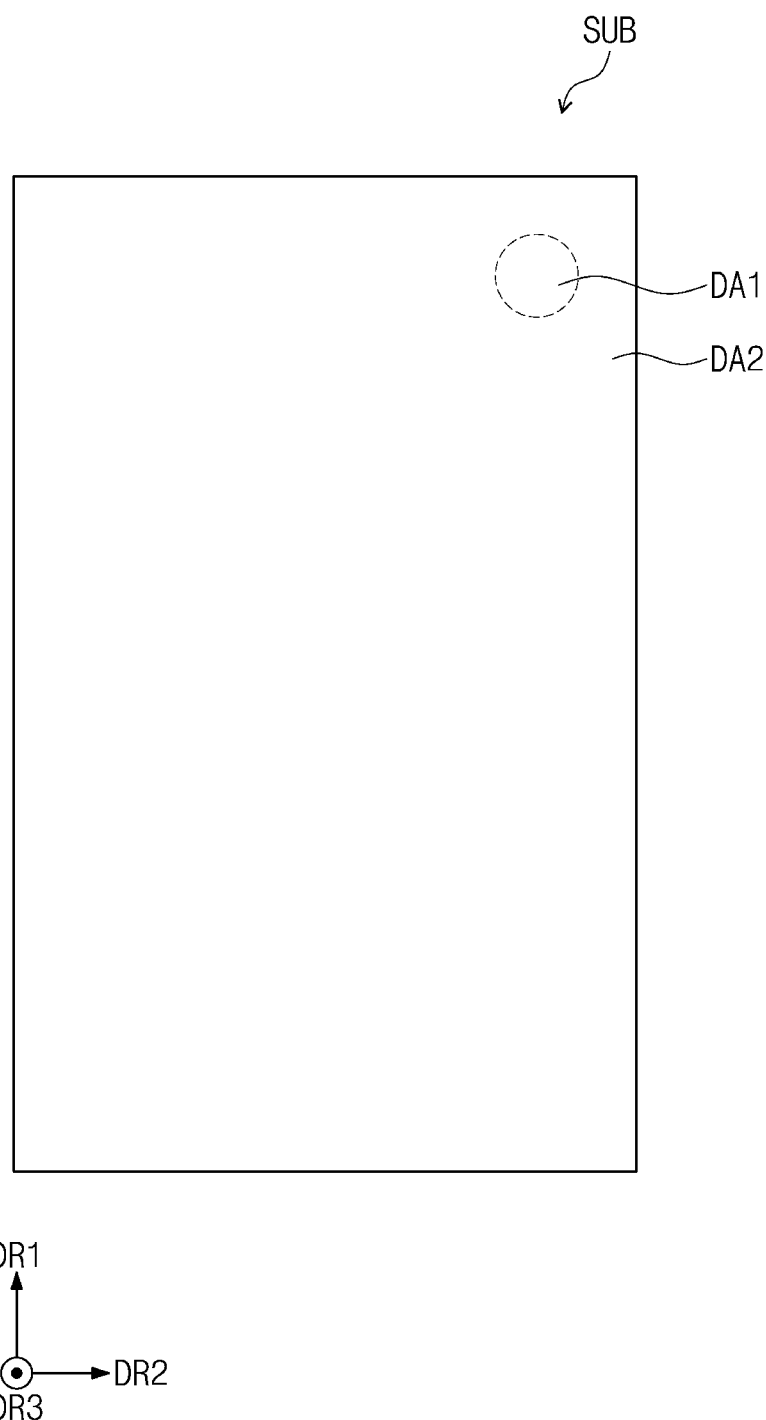
FIGS. 6A and 6B schematically illustrate plan views showing a substrate of a display device according to embodiments of the invention.
Figure 6B:
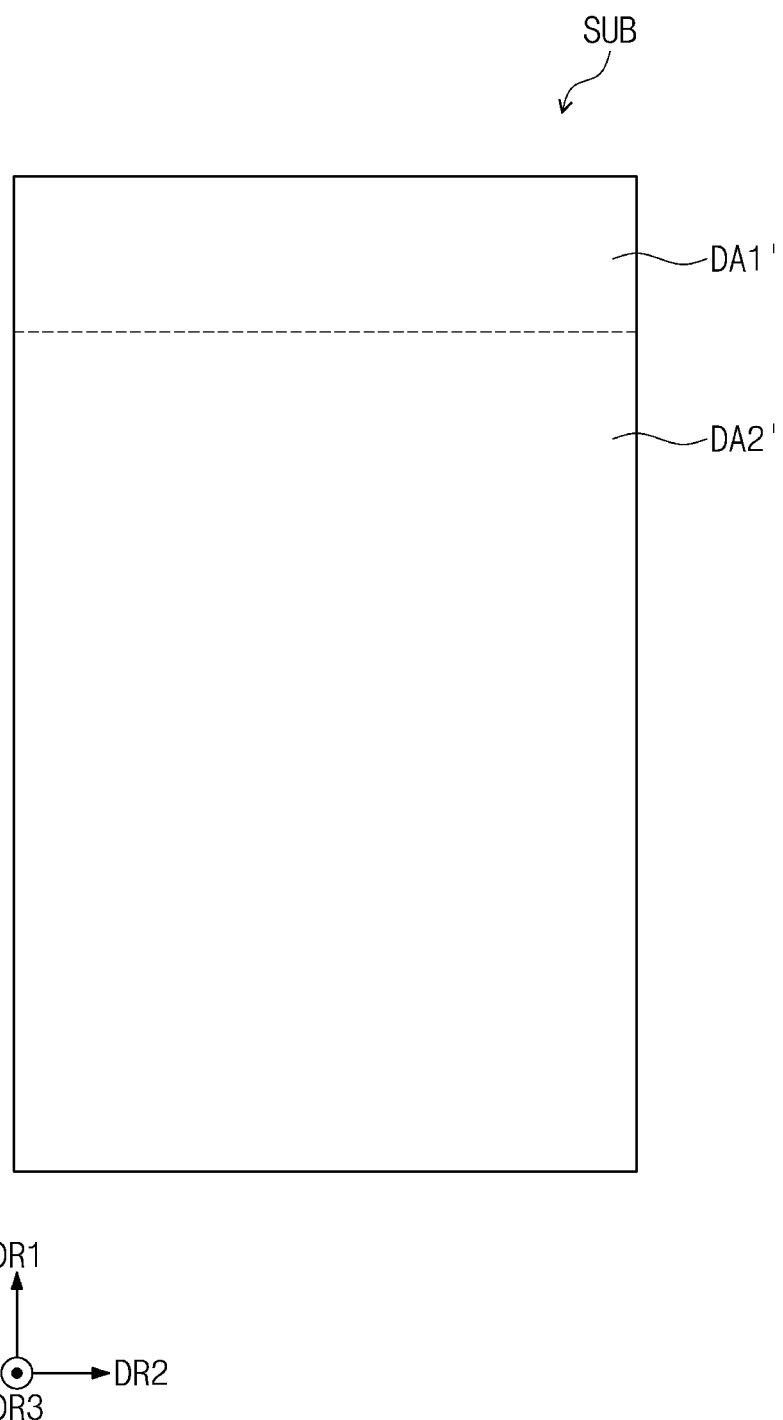

FIGS. 6A and 6B schematically illustrate plan views showing a substrate of a display device according to embodiments of the invention. In figures below, the illustration of the non-display region NDA will be omitted for convenience of description.

Referring to FIG. 6A, the substrate SUB may include a first display region DA1 and a second display region DA2. The first display region DA1 and a second display region DA2 may be sections that overlap the display region DA discussed above. For example, the first display region DA1 and the second display region DA2 may be imaginary regions that may be defined in any of layers included in the display device DD. For brevity of description, the following will discuss an example in which the first display region DA1 and the second display region DA2 may be defined in the substrate SUB.

The second display region DA2 may surround the first display region DA1. For example, in a plan view, the second display region DA2 may have a rectangular shape, and the first display region DA1 may have a circular shape. In a plan view, the first display region DA1 may be placed at an inner right top end of the second display region DA2.

The first display region DA1 and the second display region DA2, however, are not limited to the shapes mentioned above. In a plan view as shown in FIG. 6B, a first display region DA1' may extend in the first direction DR1 while being adjacent to a second display region DA2'. For example, the first display region DA1' may have a rectangular shape elongated in the second direction DR2, and the second display region DA2' may have a rectangular shape elongated in the first direction DR1. The first display region DA1' may extend in the first direction DR1 from a short side of the second display region DA2'. For example, in a plan view, the first display region DA1' may be defined as an upper portion, and the second display region DA2' may be defined as a lower portion.

The following will explain an example in which the first and second display regions DA1 and DA2 have shapes illustrated in FIG. 6A.

Figure 7:
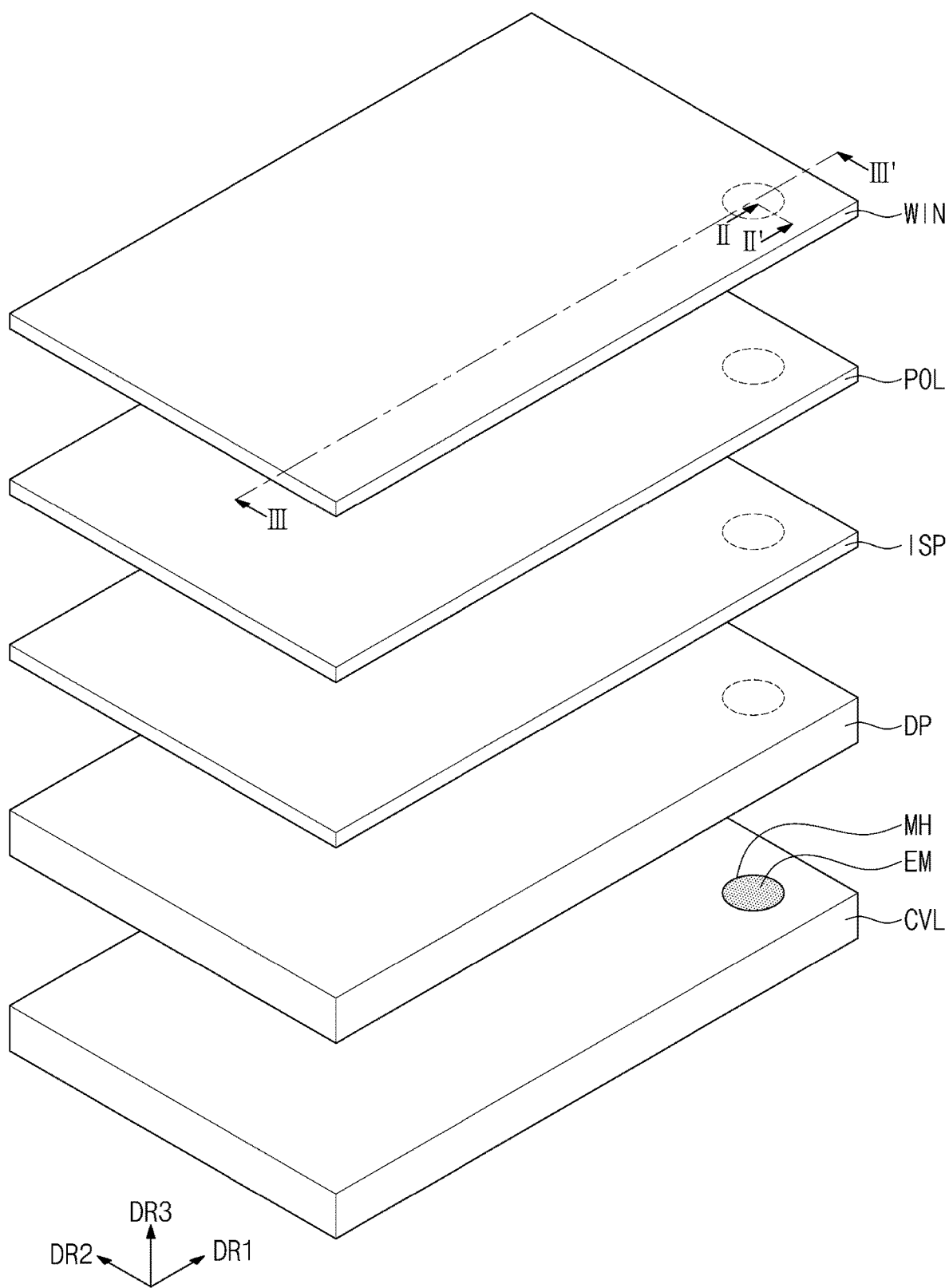
FIG. 7 schematically illustrates an exploded perspective view showing the display device of FIG. 1.

FIG. 7 schematically illustrates an exploded perspective view showing the display device of FIG. 1.

Referring to FIG. 7, sections overlapping the first and second display regions DA1 and DA2 may be defined in each of the window WIN, the antireflection layer POL, the input sensing part ISP, and the display panel DP. As shown in FIG. 7, each of the window WIN, the antireflection layer POL, the input sensing part ISP, and the display panel DP may be configured such that a circular section at its right top end may overlap the first display region (see DA1 of FIG. 6A) of the substrate SUB, and that the remainder other than the circular section may overlap the second display region (see DA2 of FIG. 6A) of the substrate SUB.

The cover layer CVL may include a module hole MH. The module hole MEI may overlap the first display region DA1. For example, the module hole MH may have a circular shape in a plan view.

An electronic module EM may be inserted into the module hole MH. The electronic module EM may overlap the first display region DA1. The electronic module EM may use external light to recognize user's input information. For example, the electronic module EM may include a camera module, a light-receiving module, a motion recognition module, a fingerprint detection sensor, an illumination sensor, or any various types of modules or sensors. It may be desirable that the first display region DA1 and its overlapping section should have high transmittance for stable operation of the electronic module EM.

Figure 8:
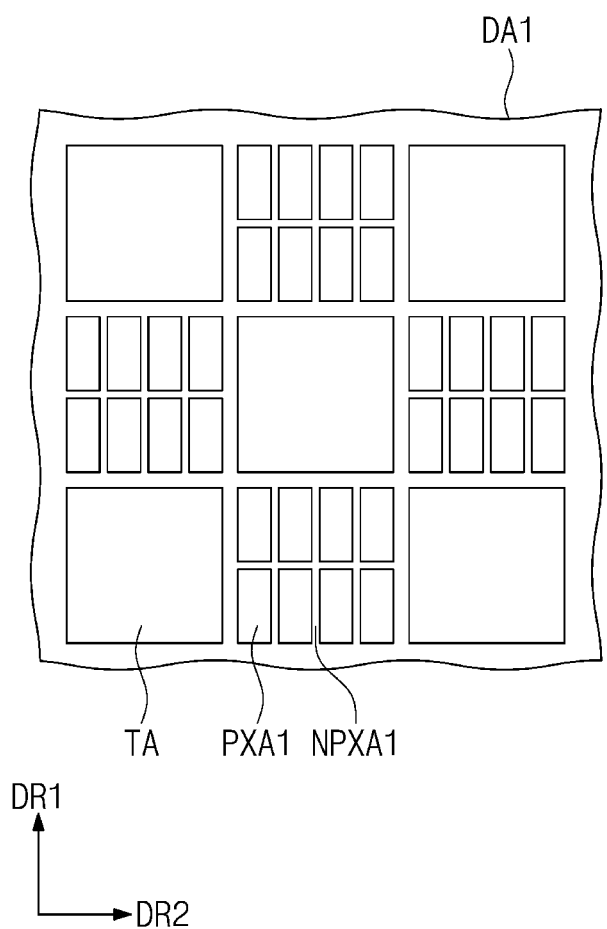
FIG. 8 schematically illustrates a plan view partially showing a pixel layer in a first display region of FIG. 6A.
Figure 9:
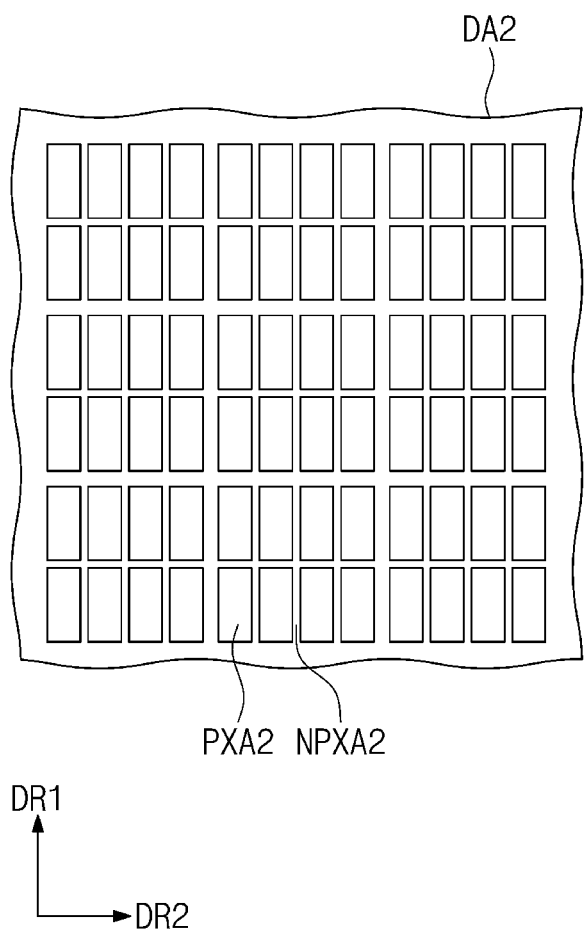
FIG. 9 schematically illustrates a plan view partially showing a pixel layer in a second display region of FIG. 6A.

FIG. 8 schematically illustrates a plan view partially showing the pixel layer disposed in the first display region of FIG. 6A. FIG. 9 schematically illustrates a plan view partially showing the pixel layer in the second display region of FIG. 6A.

Referring to FIG. 8, the pixel layer PXL may include transmission regions TA, first light emitting regions PXA1, and first non-light emitting regions NPXA1, all of which areas overlap the first display region DA1.

Each of the transmission regions TA may have a tetragonal shape in a plan view. When the display panel DP receives light that may be incident from outside the display device DD, the light may reach components disposed below the pixel layer PXL after passing through the transmission regions TA of the pixel layer PXL. The transmission regions TA may be spaced apart from each other at a certain interval.

First light emitting regions PXA1 may be disposed between the transmission regions TA. For example, eight first light emitting regions PXA1 may be disposed between neighboring two transmission regions TA. When the light emitting element (see OLED of FIG. 5) generates light, the first light emitting regions PXA1 may emit the light from the light emitting element OLED to an outside of the display device DD.

When viewed in a plan view, one transmission region TA may have an area the same as a sum of areas of eight first light emitting regions PXA1 and areas of the first non-light emitting regions NPXA1 between the eight first light emitting regions PXA1.

The invention, however, is not limited to the aforementioned arrangement of the first light emitting regions PXA1 between the transmission regions TA. The arrangement of the first light emitting regions PXA1 may be changed depending on a size and shape of the light emitting element OLED and/or a type of the electronic module EM disposed in the first display region DA1.

Referring to FIG. 9, the pixel layer PXL may include, in the second display region DA2, second light emitting regions PXA2 and second non-light emitting regions NPXA2. The pixel layer PXL in the second display region DA2 may not include the transmission region TA. Therefore, the number of light emitting regions per the same area may be larger on the second display region DA2 than in the first display region DA1.

In conclusion, in a plan view, a total area of the first light emitting regions PXA1 per unit area may be smaller than a total area of the second light emitting regions PXA2 per unit area. The unit area may be, for example, square inches.

Figure 10:
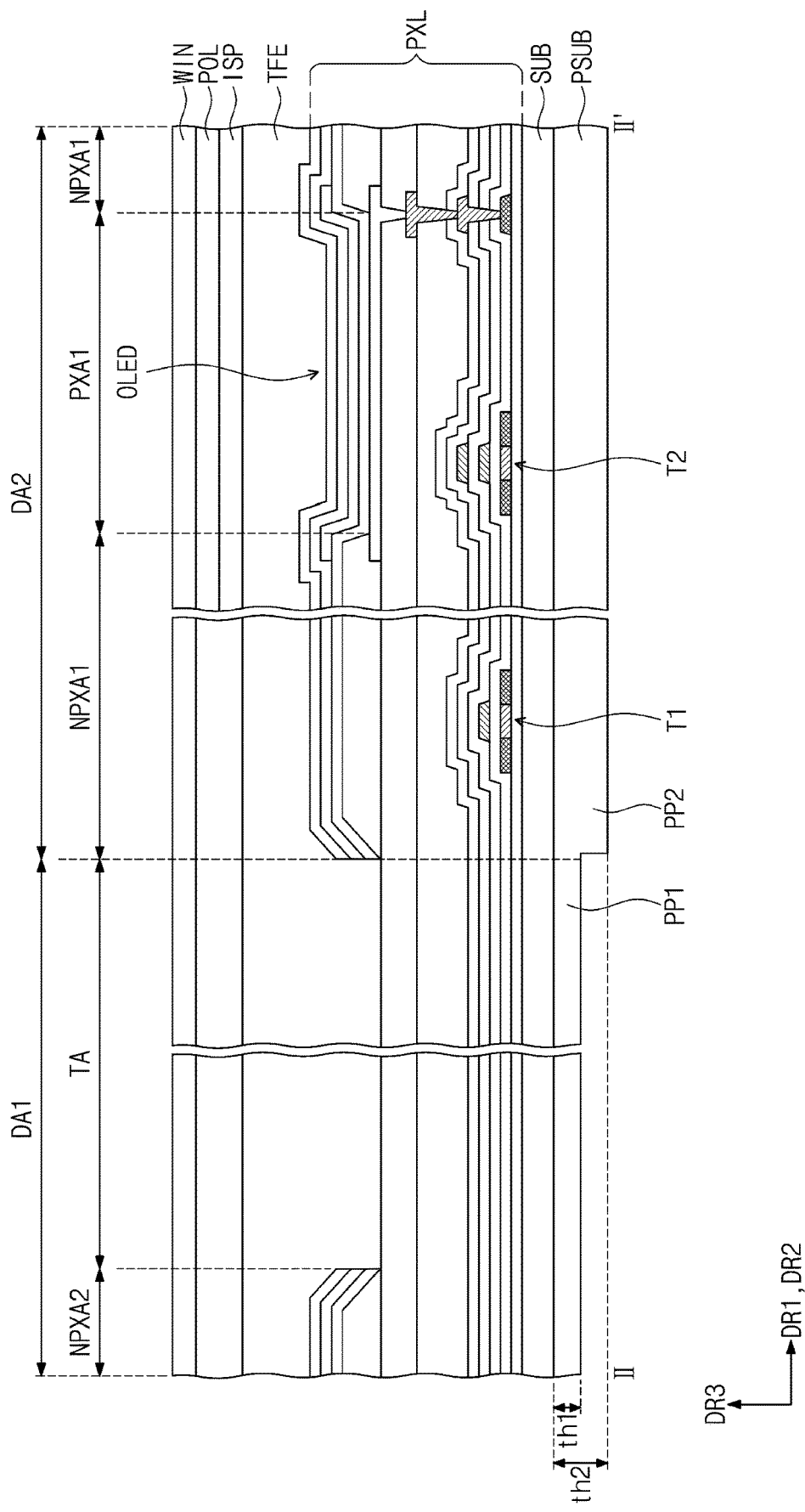
FIG. 10 schematically illustrates a cross-sectional view taken along line II-IF of FIG. 7.

FIG. 10 schematically illustrates a cross-sectional view taken along line II-IF of FIG. 7.

FIG. 10 shows a cross-sectional view in the vicinity of a boundary between the first display region DA1 and the second display region DA2. For convenience of description of the embodiment shown in FIG. 10, reference symbols to detailed components of the pixel layer PXL will be omitted.

Referring to FIG. 10, neither the first and second transistors T1 and T2 nor the light emitting element OLED may be disposed in the transmission region TA of the pixel layer PXL. For example, the transmission region TA of the pixel layer PXL may be sequentially provided therein with the buffer layer BFL on the substrate SUB and the first to sixth dielectric layers 10 to 60 on the buffer layer BFL. None of the hole control layer HCL, the electron control layer ECL, and the second electrode CE of the light emitting element OLED may be disposed on the sixth dielectric layer 60 of the transmission region TA. The thin-film encapsulation layer TFE may be disposed on the sixth dielectric layer 60 of the transmission regions TA.

Consequently, since the pixel layer PXL in the first display region DA1 includes transmission regions TA, a section overlapping the first display region DA1 may have a light transmittance greater than that of a section overlapping the second display region DA2.

The protective layer PSUB may include a first part PP1 and a second part PP2. The first part PP1 may be disposed in the first display region DA1, and the second part PP2 may be disposed in the second display region DA2.

The first part PP1 may have a thickness in the third direction DR3 less than a thickness in the third direction DR3 of the second part PP2. For example, the first part PP1 may have a first thickness th1. The second part PP2 may have a second thickness th2. The first thickness th1 may be less than the second thickness th2.

Figure 11:
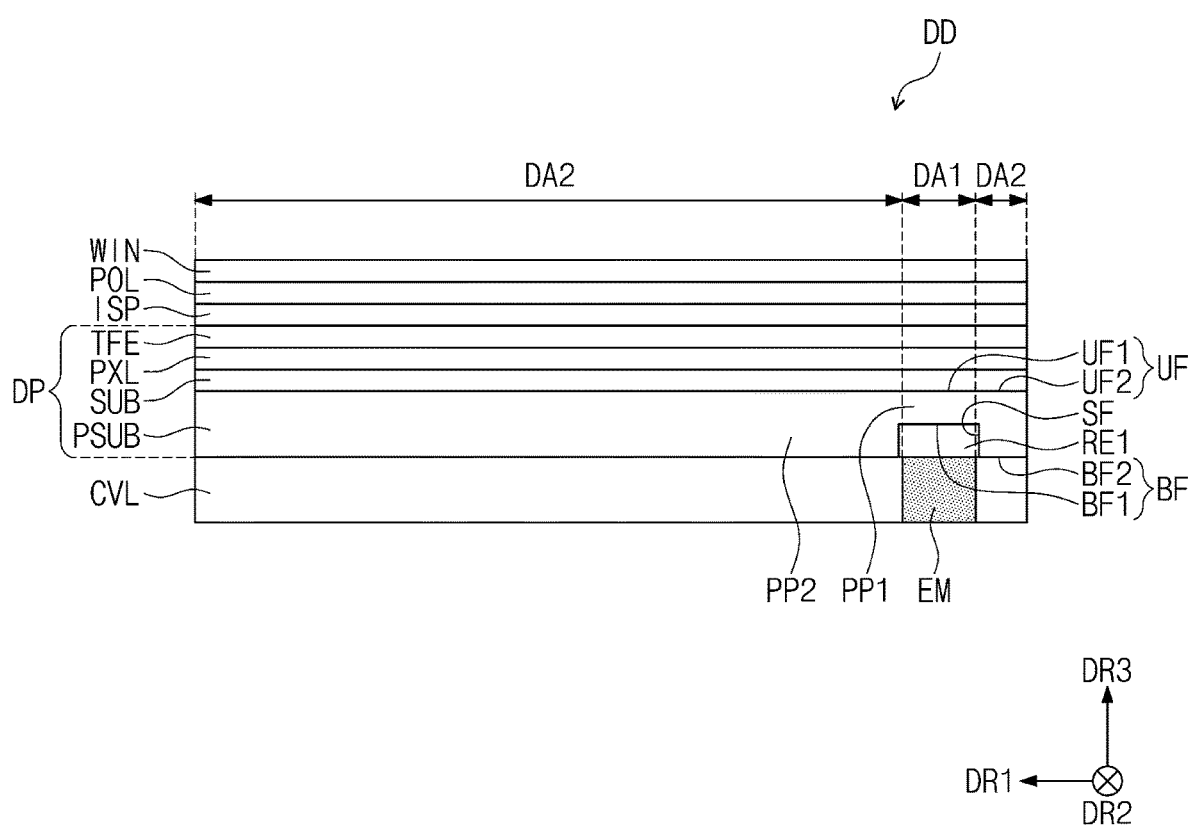
FIG. 11 schematically illustrates a cross-sectional view taken along line of FIG. 7.

FIG. 11 schematically illustrates a cross-sectional view taken along line of FIG. 7.

Referring to FIG. 11, the protective layer PSUB may have a top surface UF and a bottom surface BF opposite to the top surface UF, and the first part PP1 of the protective layer PSUB may have a first recess RE1 that may be recessed from the bottom surface BF toward the top surface UF of the protective layer PSUB. The first recess RE1 may overlap the first display region DA1.

The top surface UF of the protective layer PSUB may include a first top surface UF1 and a second top surface UF2. The first part PP1 may have the first top surface UF1 at its side that faces the substrate SUB. The second part PP2 may have the second top surface UF2 at its side that faces the substrate SUB.

The first and second top surfaces UF1 and UF2 may be disposed on the same plane. For example, the first and second top surfaces UF1 and UF2 may be located at the same height (or level) with respect to the third direction DR3.

The bottom surface BF of the protective layer PSUB may include a first bottom surface BF1 and a second bottom surface BF2. The first bottom surface BF1 may be opposite to the first top surface UF1. The second bottom surface BF2 may be opposite to the second top surface UF2.

A distance between the first bottom surface BF1 and the first top surfaces UF1 of the first part PP1 may be less than a distance between the second bottom BF2 and top surfaces UF2 of the second part PP2. The first recess RE1 may correspond to a space between the first bottom surface BF1 and the electronic module EM.

In an embodiment, the first bottom surface BF1 may be parallel to the first top surface UF1. For example, the first bottom surface BF1 may be a flat surface.

The first recess RE1 may be defined by the first bottom surface BF1 and a side surface SF. The side surface SF may be formed between the first bottom surface BF1 of the first part PP1 and the second bottom surface BF2 of the second part PP2. The side surface SF may define a step difference between the first bottom surface BF1 and the second bottom surface BF2.

Figure 12:
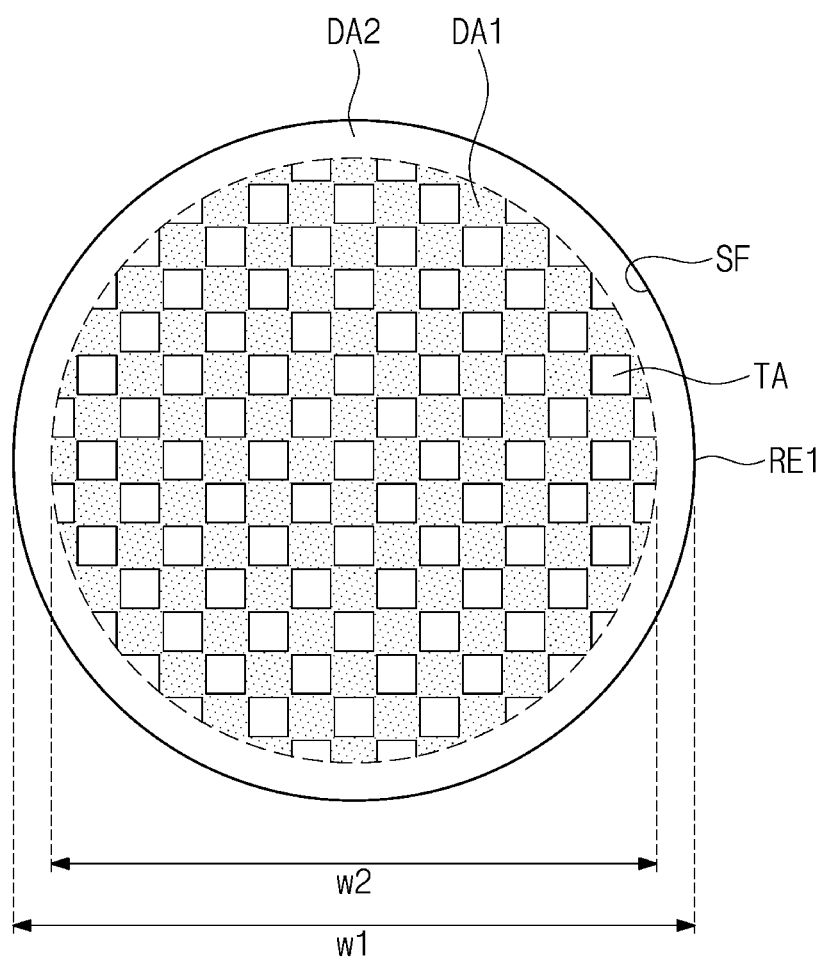
FIG. 12 schematically illustrates a diagram when viewed upwardly from an electronic module of FIG. 7.

FIG. 12 schematically illustrates a diagram when viewed upwardly from the electronic module of FIG. 7. The number and shapes of transmission regions TA shown in FIG. 12 are presented as embodiments, and the invention is not limited thereto.

The first part PP1 may have an area greater than that of the first display region DA1 in a plan view. Referring to FIGS. 11 and 12, the first part PP1 may have a diameter the same as a diameter w1 of the first recess RE1. The diameter w1 of the first recess RE1 may be greater than a diameter w2 of the first display region DA1. For example, a portion of the first part PP1 may extend into the second display region DA2, and the first part PP1 may have an edge that partially overlaps the second display region DA2.

When viewed upwardly from a location where the electronic module EM may be placed, the first display region DA1 may be disposed within the first recess RE1. Transmission regions TA of the pixel layer PXL may be visible through the first display region DA1. A section between the transmission regions TA may be provided therein with the light emitting element OLED and the transistors (see T1 and T2 of FIG. 5). The light emitting element OLED and the transistors T1 and T2 may shield most of light that may be externally incident. Therefore, the section between the transmission regions TA may appear darker than the transmission regions TA.

According to some embodiments of the invention, since transmission regions TA may be disposed to overlap the first display region DA1, a section overlapping the first display region DA1 may have a light transmittance greater than that of the second display region DA2. As a result, an amount of light reaching the electronic module EM may increase to improve operating reliability of the electronic module EM.

According to some embodiments of the invention, since the first part PP1 in the first display region DA1 has a thickness less than that of the second part PP2 in the second display region DA2, a section overlapping the first display region DA1 may have an increased light transmittance. As a result, the electronic module EM may increase in operating reliability.

According to some embodiments of the invention, since the first recess RE1 may be formed wider than the first display region DA1, it may be avoided that the side surface SF of the first recess RE1 causes loss of light that passes through the first part PP1.

FIGS. 13 to 16 schematically illustrate diagrams showing a display device according to embodiments of the invention. The following will discuss display devices DD-1, DD-2, and DD-3 according to other embodiments of the invention with reference to FIGS. 13 to 16. In FIGS. 13 to 16, the same reference symbols are allocated to the same components as those discussed above. Therefore, the following will focus on descriptions of different components from those of the embodiments mentioned above, and explanations of the same components will be omitted.

Figure 13:
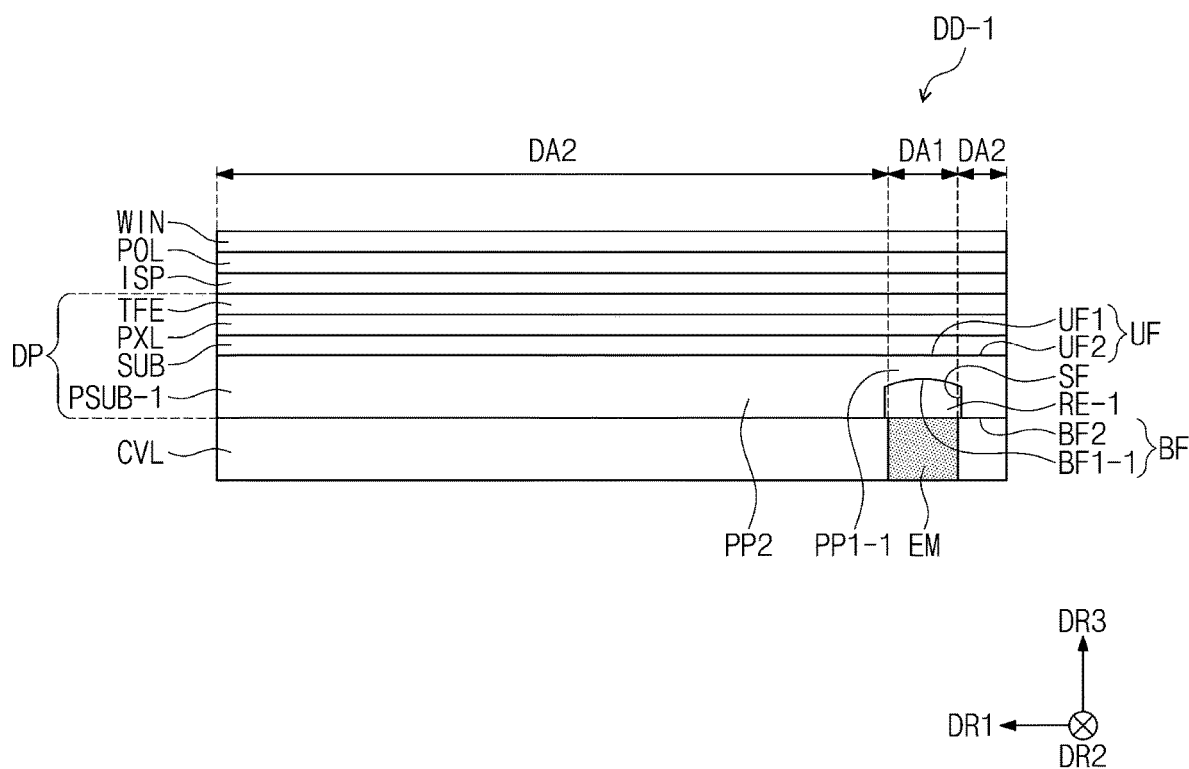
FIGS. 13 to 16 schematically illustrate diagrams showing a display device according to embodiments of the invention.

Referring to FIG. 13, a first bottom surface BF1-1 of a protective layer PSUB-1 (above recess RE-1) may have a concave shape with respect to the first top surface UF1. For example, a distance between the first bottom surface BF1-1 and the first top surface UF1 may be the smallest at a central point of the first bottom surface BF1-1. The distance between the first bottom surface BF1-1 and the first top surface UF1 may gradually increase as departing from the central point.

According to an embodiment, since the first bottom surface BF1-1 has a concave shape, a first part PP1-1 may serve as a concave lens. For example, the first part PP1-1 may diverge light that may be incident toward the electronic module EM from outside the display device DD-1.

Figure 14:
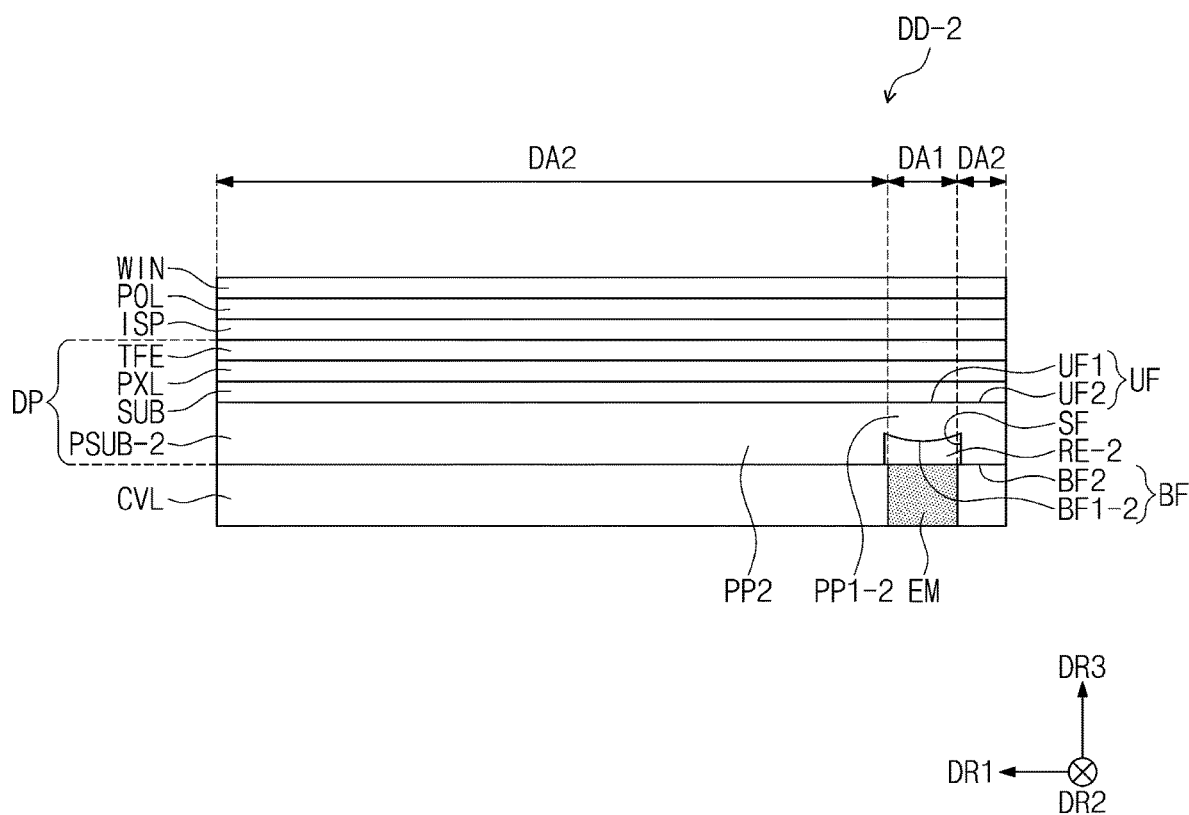

Referring to FIG. 14, a first bottom surface BF1-2 of a protective layer PSUB-2 (above recess RE-2) may have a convex shape with respect to the first top surface UF1. For example, a distance between the first bottom surface BF1-2 and the first top surface UF1 may be the largest at a central point of the first bottom surface BF1-2. The distance between the first bottom surface BF1-2 and the first top surface UF1 may gradually decrease as departing from the central point. Since the first bottom surface BF1-2 has a convex shape, a first part PP1-2 may serve as a convex lens. For example, the first part PP1-2 may converge light that may be incident toward the electronic module EM from outside the display device DD-2.

According to some embodiments of the invention, since the first part PP1-1 or PP1-2 serves as a concave lens or a convex lens, it may be possible, if necessary, to diverge or converge external light that reaches the electronic module EM. Therefore, the external light that reaches the electronic module EM may be controlled even without separately placing a lens in position between the electronic module EM and the protective layer P SUB.

Figure 15:
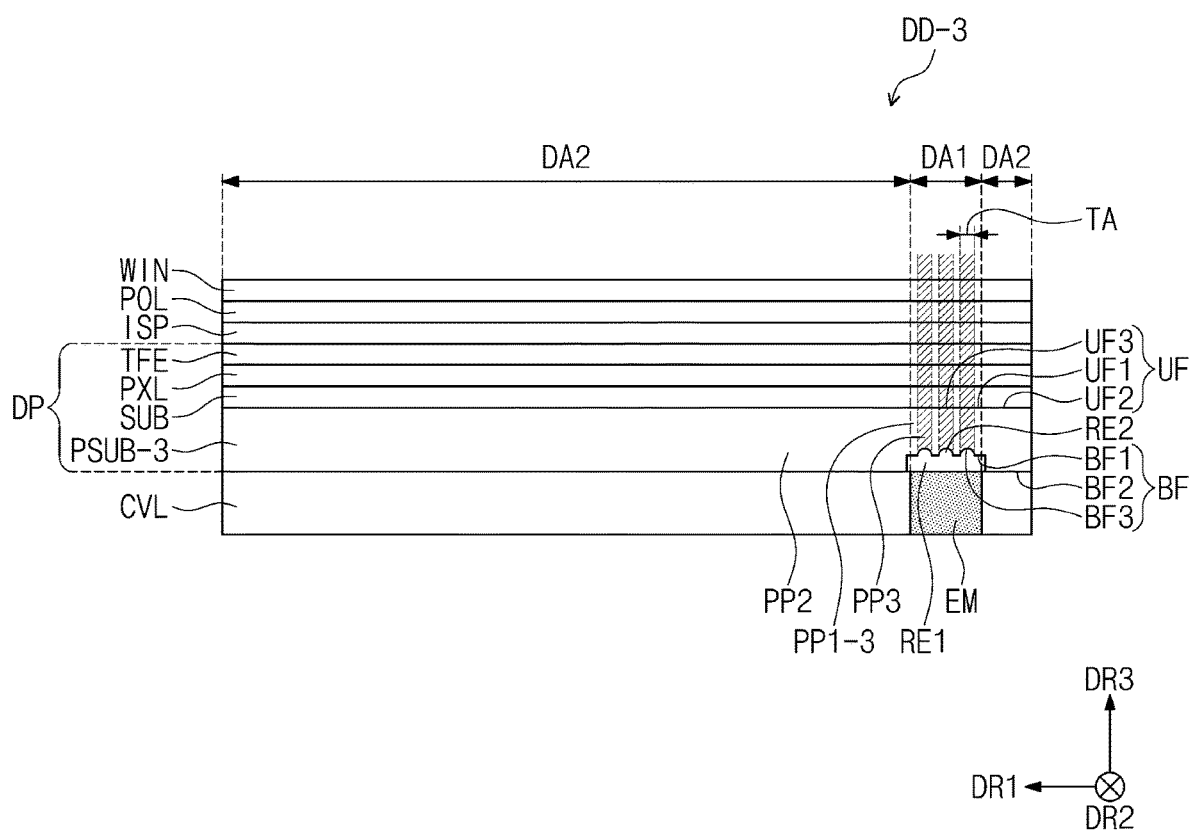

Referring to FIG. 15, a protective layer PSUB-3 may include a first part PP1-3, a second part PP2, and third parts PP3. The third parts PP3 may be correspondingly disposed in the transmission regions TA of the pixel layer PXL. The number of the third parts PP3 may be the same as the number of the transmission regions TA of the pixel layer PXL. FIG. 15 shows three third parts PP3, but the number of the third parts PP3 may practically be greater than three.

The first part PP1-3 may have a thickness less than that of the second part PP2, and each of the third parts PP3 may have a thickness less than that of the first part PP1-3. For example, a protective layer PSUB-3 may be configured such that the third parts PP3 have the smallest thickness.

The third parts PP3 may have second recesses RE2 that may be recessed from the first bottom surface BF1 of the first part PP1-3 toward the first top surface UF1 of the first part PP1-3.

A top surface UF of the protective layer PSUB-3 may include a first top surface UF1, a second top surface UF2, and third top surfaces UF3. The third parts PP3 may each have the third top surface UF3 at its side that faces the substrate SUB.

The first top surface UF1, the second top surface UF2, and the third top surfaces UF3 may all be disposed on the same plane. The first, second, and third top surfaces UF1, UF2, and UF3 may be located at the same height (or level) with respect to the third direction DR3.

A bottom surface BF of the protective layer PSUB-3 may include a first bottom surface BF1, a second bottom surface BF2, and third bottom surfaces BF3. The third bottom surfaces BF3 may be correspondingly opposite to the third top surfaces UF3.

A distance between the first bottom and top surfaces BF1 and UF1 of the first part PP1-3 may be less than a distance between the second bottom and top surfaces BF2 and UF2 of the second part PP2, and a distance between the third bottom and top surfaces BF3 and UF3 of the third part PP3 may be less than the distance between the first bottom and top surfaces BF1 and UF1 of the first part PP1-3.

The third bottom surfaces BF3 may have concave shapes with respect to corresponding third top surfaces UF3. For example, each of the third bottom surfaces BF3 may serve as a concave lens. The shapes of the third bottom surfaces BF3 are not limited thereto. For example, the third bottom surfaces BF3 may have flat or convex shapes with respect to corresponding third top surfaces UF3.

According to some embodiments of the invention, since the protective layer PSUB-3 further includes third parts PP3 each having a reduced thickness in the first part PP1-3, a section overlapping the first display region DA1 may further increase in light transmittance.

According to some embodiments of the invention, the third parts PP3 may be disposed in the transmission regions TA, such that a section overlapping transmission regions TA may have a further increased light transmittance.

Each of the third parts PP3 serves as a lens, such that it may be possible to precisely control divergence or convergence of external light that passes through the transmission regions TA.

Figure 16:
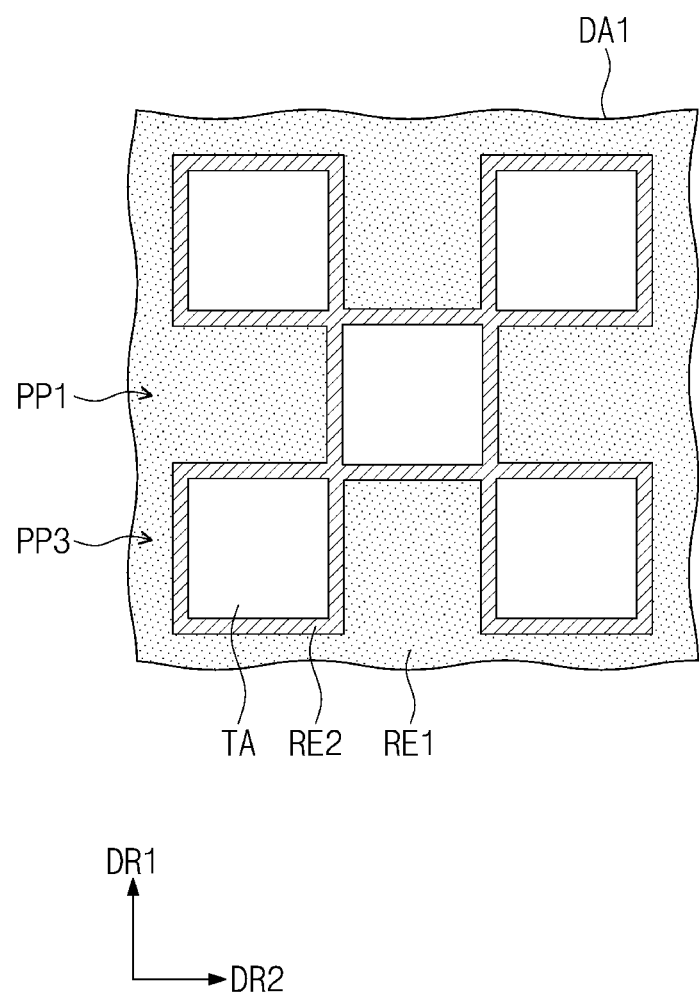

FIG. 16 illustrates a diagram when viewed upwardly from the electronic module EM of the display device DD-3. Referring to FIG. 16, area of each of the third parts PP3 may greater than that of each of the transmission regions TA. Each of the third parts PP3 may have area the same as that of the second recess RE2.

When viewed upwardly from a location where the electronic module EM may be placed, the second recesses RE2 may be disposed within the first recess RE1. The transmission region TA may be disposed within each of the second recesses RE2.

According to some embodiments of the invention, a protective layer may include a first part in a first display region and a second part in a second display region, and the first part may have a thickness less than that of the second part, with the result that a section overlapping an electronic module may increase in light transmittance.

Although the invention is described in conjunction with some example embodiments thereof, it would be understood by those skilled in the art that the invention can be modified or changed in various ways without departing from spirit and scope of the inventive concepts defined by the appended claims, including equivalents. Further, the embodiments disclosed herein are not intended to limit the technical spirit of the invention and all technical spirit within the claims and their equivalents should be construed as being included in the invention.

What is claimed is:

1. A display device, comprising:
  a substrate including a first display region and a second display region adjacent to the first display region;
  a pixel layer disposed on the substrate and including transmission regions that overlap the first display region; and
  a protective layer below the substrate, the protective layer including:
    a first part below the first display region; and
    a second part below the second display region, wherein the first part has a thickness less than a thickness of the second part.

2. The display device of claim 1, wherein the first part includes a first recess that is recessed from a bottom surface of the protective layer toward a top surface of the protective layer, the bottom surface being opposite to the top surface that faces the substrate.

3. The display device of claim 2, wherein
a first top surface of the first part and a second top surface of the second part are disposed on a same plane, and
a distance between a first bottom surface of the first part and the first top surface of the first part is less than a distance between a second bottom surface of the second part and the second top surface of the second part.

4. The display device of claim 3, wherein the first bottom surface is parallel to the first top surface.

5. The display device of claim 3, wherein the first bottom surface has a concave shape with respect to the first top surface.

6. The display device of claim 3, wherein the first bottom surface has a convex shape with respect to the first top surface.

7. The display device of claim 3, wherein
the protective layer further includes third parts below the transmission regions, and
each of the third parts has a thickness less than the thickness of the first part.

8. The display device of claim 7, wherein the third parts have second recesses that are recessed from the first bottom surface of the first part toward the first top surface of the first part.

9. The display device of claim 8, wherein
the first top surface of the first part, the second top surface of the second part, and a third top surface of the third part are disposed on a same plane, and
a distance between a third bottom surface of the third part and the third top surface of the third part is less than the distance between the first bottom surface of the first part and the first top surface of the first part.

10. The display device of claim 9, wherein the third bottom surface has a concave shape with respect to the third top surface.

11. The display device of claim 7, wherein each of the third parts has an area greater than an area of a corresponding one of the transmission regions in a plan view.

12. The display device of claim 1, wherein, the first part has an area greater than an area of the first display region in a plan view.

13. The display device of claim 1, wherein the pixel layer includes:
first light emitting regions on the first display region; and
second light emitting regions on the second display region.

14. The display device of claim 13, wherein a total area of the first light emitting regions per unit area is greater than a total area of the second light emitting regions per unit area in a plan view.

15. The display device of claim 13, wherein the first light emitting regions are disposed between the transmission regions.

16. The display device of claim 1, wherein the second display region surrounds the first display region in a plan view.

17. The display device of claim 1, wherein the first display region extends from a side of the second display region in a plan view.

18. The display device of claim 1, further comprising an electronic module below the first part.

19. A display device, comprising:
a substrate including a first display region and a second display region adjacent to the first display region;
a pixel layer disposed on the substrate and including transmission regions that overlap the first display region;
a protective layer below the substrate; and
an electronic module that overlaps the first display region and is disposed below the protective layer, wherein
the protective layer includes a recess that overlaps the first display region.

20. The display device of claim 19, wherein the recess is recessed from a bottom surface of the protective layer toward a top surface of the protective layer, the bottom surface being opposite to the top surface.

* * * * *